United States Patent
Lane et al.

(10) Patent No.: US 11,156,913 B2
(45) Date of Patent: Oct. 26, 2021

(54) NANOIMPRINT LITHOGRAPHY PROCESS USING LOW SURFACE ENERGY MASK

(71) Applicant: Facebook Technologies, LLC, Menlo Park, CA (US)

(72) Inventors: Austin Lane, Redmond, WA (US); Matthew E. Colburn, Woodinville, WA (US); Giuseppe Calafiore, Redmond, WA (US); Nihar Ranjan Mohanty, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 211 days.

(21) Appl. No.: 16/252,565

(22) Filed: Jan. 18, 2019

(65) Prior Publication Data

US 2019/0346761 A1    Nov. 14, 2019

Related U.S. Application Data

(60) Provisional application No. 62/669,212, filed on May 9, 2018.

(51) Int. Cl.
 *B29C 59/02*     (2006.01)
 *G03F 7/00*      (2006.01)
 (Continued)

(52) U.S. Cl.
 CPC .......... *G03F 7/0002* (2013.01); *G03F 7/0043* (2013.01); *G03F 7/027* (2013.01); *G03F 7/039* (2013.01); *G03F 7/16* (2013.01); *G03F 7/2002* (2013.01); *G03F 7/36* (2013.01); *G03F 7/70491* (2013.01)

(58) Field of Classification Search
 CPC ........ G03F 7/0002; G03F 7/16; G03F 7/0043; G03F 7/027; G03F 7/039; G03F 7/2002; G03F 7/36; G03F 7/70491
 See application file for complete search history.

(56) References Cited

U.S. PATENT DOCUMENTS

2004/0137734 A1   7/2004  Chou et al.
2006/0255505 A1   11/2006 Sandhu et al.
(Continued)

OTHER PUBLICATIONS

Lan, H. et al. "UV-Nanoimprint Lithography: Structure, Materials and Fabrication of Flexible Molds." Journal of Nanoscience and Nanotechnology, vol. 13, No. 5, May 2013, pp. 3145-3172.
(Continued)

*Primary Examiner* — Ryan M Ochylski
(74) *Attorney, Agent, or Firm* — Fenwick & West LLP

(57) ABSTRACT

A method is described for creating a modified mask with low surface energies for a nano-imprint lithography (NIL) imprinting process. The method includes applying a master mold to an imprint mask material to create an imprint mask. The method further includes modifying the imprint mask by applying a treatment to the imprint mask to cause a surface energy level of the imprint mask to fall below a sticking threshold. The modified imprint mask is applied to a nano-imprint lithography (NIL) material to create an imprinted NIL material layer. The surface energy level of the imprint mask causes a shape of the imprinted NIL material layer to be remain unchanged when the imprinted NIL material layer is detached from the modified imprint mask.

10 Claims, 4 Drawing Sheets

(51) Int. Cl.
- *G03F 7/20* (2006.01)
- *G03F 7/039* (2006.01)
- *G03F 7/027* (2006.01)
- *G03F 7/004* (2006.01)
- *G03F 7/16* (2006.01)
- *G03F 7/36* (2006.01)

(56) References Cited

U.S. PATENT DOCUMENTS

| | | | |
|---|---|---|---|
| 2008/0274323 A1* | 11/2008 | Raby | G11B 7/263 428/65.2 |
| 2009/0256287 A1 | 10/2009 | Fu et al. | |
| 2009/0264317 A1 | 10/2009 | Ofir et al. | |
| 2011/0084424 A1 | 4/2011 | Kaida et al. | |
| 2012/0141738 A1 | 6/2012 | Miyake et al. | |
| 2013/0200553 A1* | 8/2013 | Yamada | B82Y 10/00 264/402 |
| 2017/0259461 A1 | 9/2017 | Rolland et al. | |
| 2018/0088468 A1 | 3/2018 | de Schiffart et al. | |
| 2019/0031939 A1* | 1/2019 | Villalpando-Paez | C09K 5/14 |
| 2019/0227429 A1* | 7/2019 | Yang | G03F 7/0002 |
| 2019/0346759 A1 | 11/2019 | Lane et al. | |
| 2019/0346760 A1 | 11/2019 | Lane et al. | |

OTHER PUBLICATIONS

United States Office Action, U.S. Appl. No. 16/252,564, filed Dec. 24, 2020, 11 pages.
United States Office Action, U.S. Appl. No. 16/252,564, filed May 24, 2021, 14 pages.
United States Office Action, U.S. Appl. No. 16/252,563, filed Jun. 8, 2021, 11 pages.
Yadav, A. "Nanoimprinting Techniques for Polymeric Electronic Devices." Dissertation, Technical University of Munich, Sep. 28, 2014, pp. i-147.

* cited by examiner

NANOIMPRINT LITHOGRAPHY PROCESS USING LOW SURFACE ENERGY MASK

CROSS REFERENCE TO RELATED APPLICATIONS

This application claims the benefit of U.S. Provisional Application No. 62/669,212, filed May 9, 2018, which is incorporated by reference in its entirety.

FIELD OF ART

The disclosure generally relates to the field of nanoimprint lithography (NIL), and specifically to NIL processes for creating and using imprint masks with low surface energies.

BACKGROUND

Nano-imprint lithography (NIL) is a process whereby nanometer scale patterns are imprinted, using mechanical processes, on an imprint material. These patterns may be three dimensional in shape (i.e., vary along three different axes). Such patterned materials may have many applications (e.g., for use to channel fluids, act as waveguides, be used for circuit patterns), and in some cases, are manufactured at a cost that is lower than optical lithography. Commonly, these patterns may be created by imprinting the NIL material with a negative mask, i.e., a mold that has an inverse pattern of the desired pattern. After imprinting the NIL material with the mask, the pattern is formed on the NIL material, and the NIL material may then be cured and passed through additional processing steps.

Preferably, when applying the mask, a NIL material with higher flexibility (i.e., lower Young's modulus) is used, so that the application of the mask does not cause the NIL material to fracture or break, especially when the mask is removed from the NIL material, due in part to friction between the surfaces of the mask and the NIL material. However, such a flexible material is not ideal during later processing steps. For these later processing steps, an NIL material with a high strength, and low flexibility, is desired instead. These materials may be more resilient during subsequent steps, such as curing.

Therefore, a problem exists with current NIL processes. The use of a high-modulus NIL material is ideal for post-processing steps, but has a high probability of breakage when detached from currently used imprint molds.

SUMMARY

Embodiments relate to creating a modified mask with low surface energies for a nano-imprint lithography (NIL) imprinting process. A master mold is applied to an imprint mask material to create an imprint mask. The imprint mask is modified by applying a treatment to the imprint mask to cause a surface energy level of the imprint mask to fall below a sticking threshold. The modified imprint mask is applied to a NIL material to create an imprinted NIL material layer. The surface energy level of the imprint mask causes a shape of the imprinted NIL material layer to be remain unchanged when the imprinted NIL material layer is detached from the modified imprint mask.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Embodiments here disclose a method and system for solving the problem of breakage of an imprinted NIL material layer when detaching from an imprint mask. In one embodiment, the solution includes creating a modified mask with low surface energies for a nano-imprint lithography (NIL) imprinting process. The method includes applying a master mold to an imprint mask material to create an imprint mask. The method further includes modifying the imprint mask by applying a treatment to the imprint mask to cause a surface energy level of the imprint mask to fall below a sticking threshold. The modified imprint mask is applied to a nano-imprint lithography (NIL) material to create an imprinted NIL material layer. The surface energy level of the imprint mask causes a shape of the imprinted NIL material layer to be remain unchanged when the imprinted NIL material layer is detached from the modified imprint mask.

EXEMPLARY PROCESS FOR NIL IMPRINTING USING IMPRINT MASK WITH LOW SURFACE ENERGY

Figure 1:
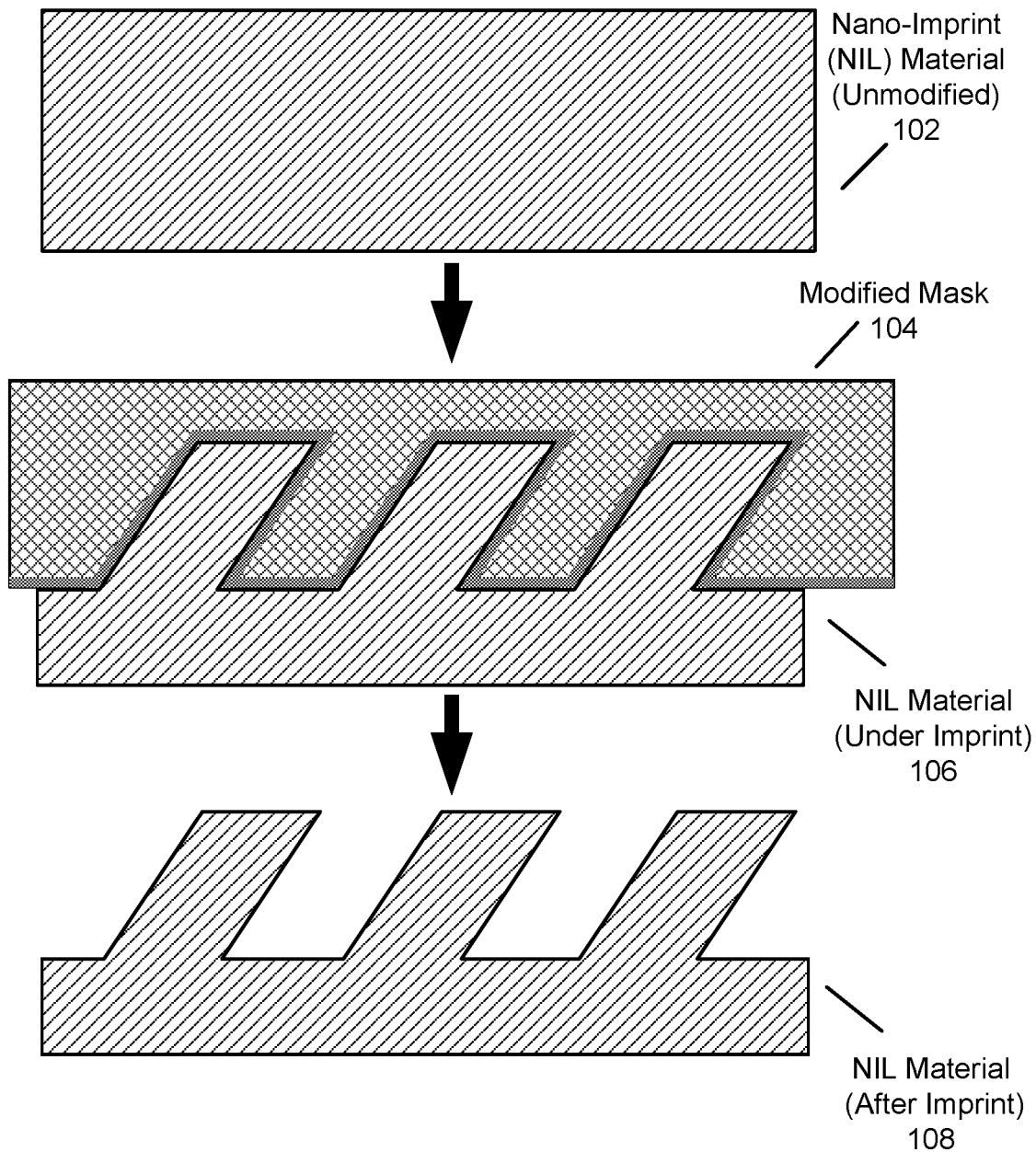
FIG. 1 illustrates an example of a process of imprinting a pattern on a nano-imprint (NIL) material using an imprint mask with low surface energy, according to an example embodiment.

FIG. 1 illustrates an example of a process of imprinting a pattern on a nano-imprint (NIL) material using an imprint mask with low surface energy, according to an example embodiment.

During an initial imprint phase, whereby a mask 104 is imprinted on the NIL material 102, a more flexible NIL material is desired because a stiffer material may break when the NIL material is released from the mask 104. However, during later processing steps, a stiffer NIL material is desired because NIL material that is flexible may suffer from feature collapse during these post processing steps (i.e., the features on the imprinted NIL material may be changed during the post processing phase in an undesired fashion).

To solve this problem, one may develop a process to change the properties of the NIL material during imprinting process. However, this may not be possible when a particular NIL material is required for the imprinting application which cannot be modified in such a fashion. Instead, one may also develop an imprint mask, such as the modified mask 104, which has a low surface energy. The surface energy of a material is a summation of all inter-molecular forces on the surface of a material, and determines the degree (positive or negative) of attraction of the surface of that material to another material. A material with a relatively lower surface energy will adhere less strongly to another material, compared to a material with a higher surface energy. Surface energy can also be considered as the difference of energy between the molecules in the bulk of a material and on its surface, i.e., the work done (per unit area) to create that surface. This difference may cause the interaction of the molecules on the surface of the material with other surfaces of other materials which they come in contact with. Surface energy may be measured as Joules per meter squared ($J/m^2$). By using an imprint mask with a low surface energy, the NIL material will be less likely to adhere to the imprint mask, and therefore breakage of the NIL material due to the detachment of the imprint mask will be reduced (e.g., reduced below a desired threshold).

FIG. 1 illustrates a general outline of such an imprinting process using an imprint mask with a low surface energy. The general process shown in FIG. 1 may be simplified from the actual ML process. Additional preparation, post-processing, and intermediary steps may be omitted for sake of clarity. The imprinting process shown in FIG. 1, and the creation of the modified mask 104, may be performed by an imprinting system, such as the NIL system 300 illustrated in FIG. 3.

The imprinting process begins with a layer of NIL material 102. This material may be any material capable of being imprinted, and may differ based on the curing method. For example, a thermally cured process may utilize a thermoplastic polymer as the NIL material 102, while an ultraviolet (UV) curing process may use a photo curable liquid resist as the NIL material 102. Additional examples of NIL material 102 may include acrylates, methacrylates, epoxides, vinyl ethers, and thiols in combination with alkene groups.

A modified mask 104 (i.e., a mold) is applied to the NIL material 102 using mechanical force. This creates a layer of imprinted NIL material 106. The modified mask 104 displaces portions of the NIL material 102 to form a pattern that is an inverse of the pattern of the modified mask 104. Portions of the NIL material 102 may migrate to fill openings within the pattern of the modified mask 104. This allows for the creation of three dimensional patterns, i.e., patterns which vary in three dimensions. For example, a profile view of a three dimensional slanted pattern is illustrated in FIG. 1.

The modified mask 104 is subsequently released from the imprinted NIL material 106. This modified mask 104 has a surface energy that is lower than a threshold level such that the breakage of the NIL material 106 due to the detachment is below a threshold percentage (e.g., breakage only in 0.1% of cases). In one embodiment, the surface energy of the modified mask 104 is below the surface energy of the NIL material 106. The modified mask 104 may be removed from the imprinted NIL material 106 in a direction that is parallel to a surface of a prominent feature that has been imprinted on the imprinted NIL material 106, such as the largest feature by dimension that has been imprinted on the NIL material 106. The speed at which the modified mask 104 is removed from the imprinted NIL material 106 may be lower than a threshold that would cause the force due to kinetic friction between the surface of the NIL material 106 and the modified mask 104 to increase beyond a yield strength of the NIL material 106.

Additional details regarding the creation of the modified mask 104 are described with reference to FIG. 2.

Subsequent to the detachment of the modified mask 104, various post processing steps may subsequently be applied to the NIL material 108 imprint layer, such as overcoating, high temperature annealing, etching, plasma application, and so on. The NIL material 108 may be of a high modulus, beyond a high modulus threshold value (e.g., >1 Gpa). Therefore, it is less likely to suffer from feature collapse of the imprinted pattern during these post-processing steps. This results in a more accurate imprinted pattern at conclusion of the NIL process compared to imprinting a material with low modulus. This also results in a more accurate product to be used in various applications. For example, if the NIL material is to be used as a waveguide grating, its optical properties will adhere more closely to design specifications by using the process described here as feature collapse is minimized, while also achieving high yields during the imprinting process due to reduction of breakage of the NIL material during the detachment of the imprint mask. Such a process is especially important for imprint patterns which have complex 3D structures or which have structures which are slanted at a highly oblique angle, as these have a higher percentage chance of breaking when the imprint mask is detached.

CREATION OF IMPRINT MASK WITH LOW SURFACE ENERGY

Figure 2:
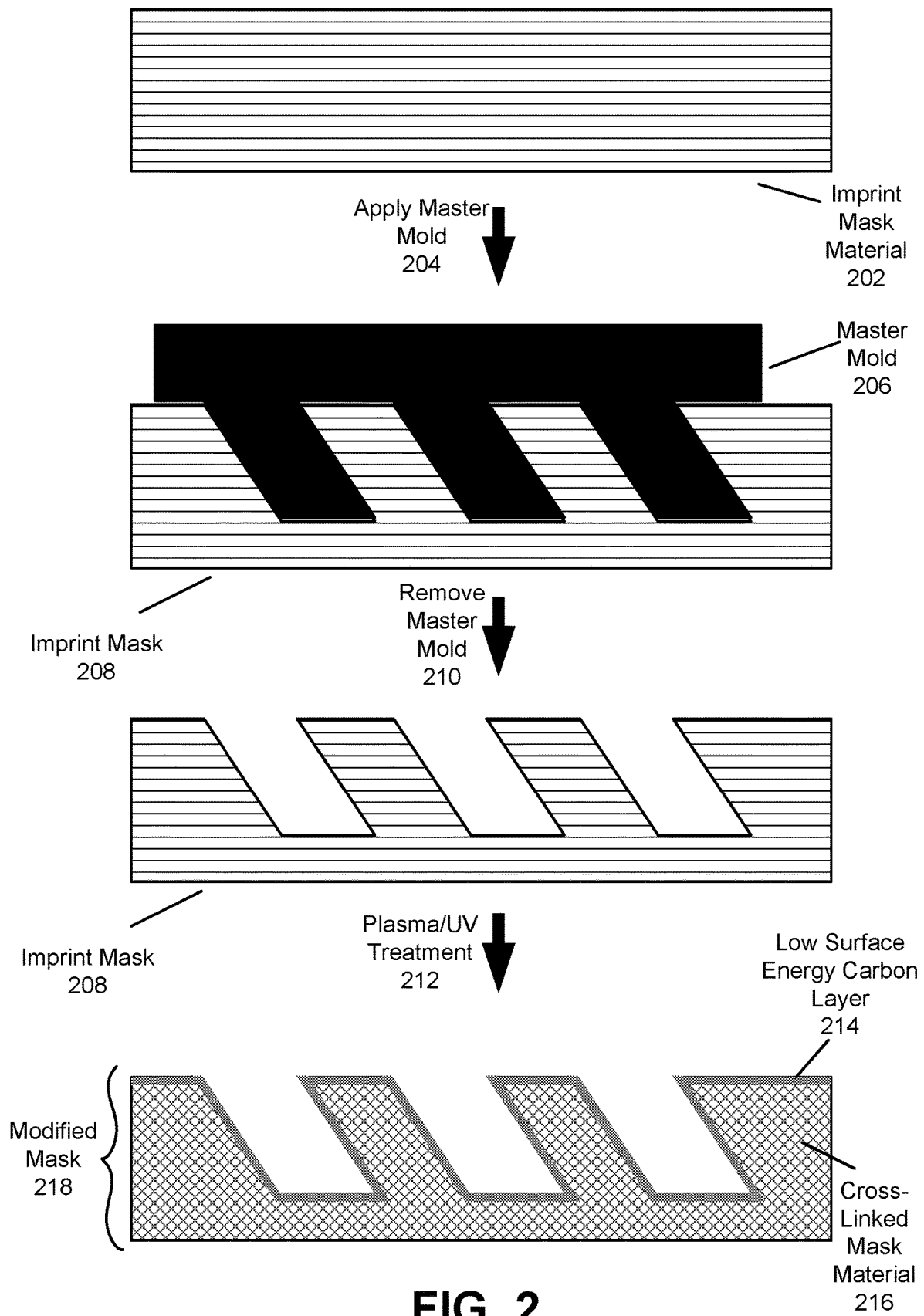
FIG. 2 illustrates a method of creating an imprint mask having low surface energy from a master mold, according to an embodiment.

FIG. 2 illustrates a method of creating an imprint mask having low surface energy from a master mold, according to an embodiment. As shown in FIG. 2, the imprint mask material 202 may begin as a block of material. However, the imprint mask material 202 may also be a liquid or highly viscous material that coated onto a substrate instead.

The master mold 206 is applied 204 to the imprint mask 202 to generate the imprint mask 208. Due to the pressure of the master mold 206 against the imprint mask material 202, the material of the imprint mask 202 will migrate into the voids within the master mold 206 and form an imprint pattern that is the inverse of the master mold 206. Subsequently the master mold 206 is removed from the imprint mask 208.

At this point the imprint mask 208 is not yet modified, and therefore it may have a relatively high surface energy. This high surface energy may cause it to adhere to NIL material which is imprinted on the imprint mask 208. This in turn may cause the NIL material to break (i.e., yield) when the imprint mask 208 is released from the NIL material after imprinting. Therefore, additional processes are applied to the imprint mask 208 to generate a modified mask, such as modified mask 104, which has a lower surface energy.

In order to reduce the surface energy of the imprint mask 208 (otherwise known as the intermediate mask), the imprint mask 208 is exposed to a fluorocarbon ($C_xF_y$) plasma treatment 212. This exposes the imprint mask 208 to CF (carbon-fluorine) radicals, ions, and VUV (vacuum ultraviolet) light (i.e., EM radiation with wavelengths of 10-200 nm). The result is that a graphitized low surface energy carbon layer 214 is formed on the surface of the modified mask 218. In addition, the polymers in the bulk of the material of the imprint mask 208 become the modified mask 218. The surface energy the modified mask 218 is modified due to this low surface energy carbon layer 214 and the cross linkage of the polymers of the imprint mask material 216. This also causes neutral species sticking on the surface of the layer. Examples of fluorocarbons that may be applied in the plasma treatment process include $CF_4$, $CHF_3$, $CH_2F_2$, $CH_3F$, $C_4F_8$, $C_4F_6$, $C_2F_6$, and $C_2F_8$.

EXEMPLARY SYSTEM FOR NANO IMPRINT LITHOGRAPHY AND MODIFIED MASK CREATION

Figure 3:
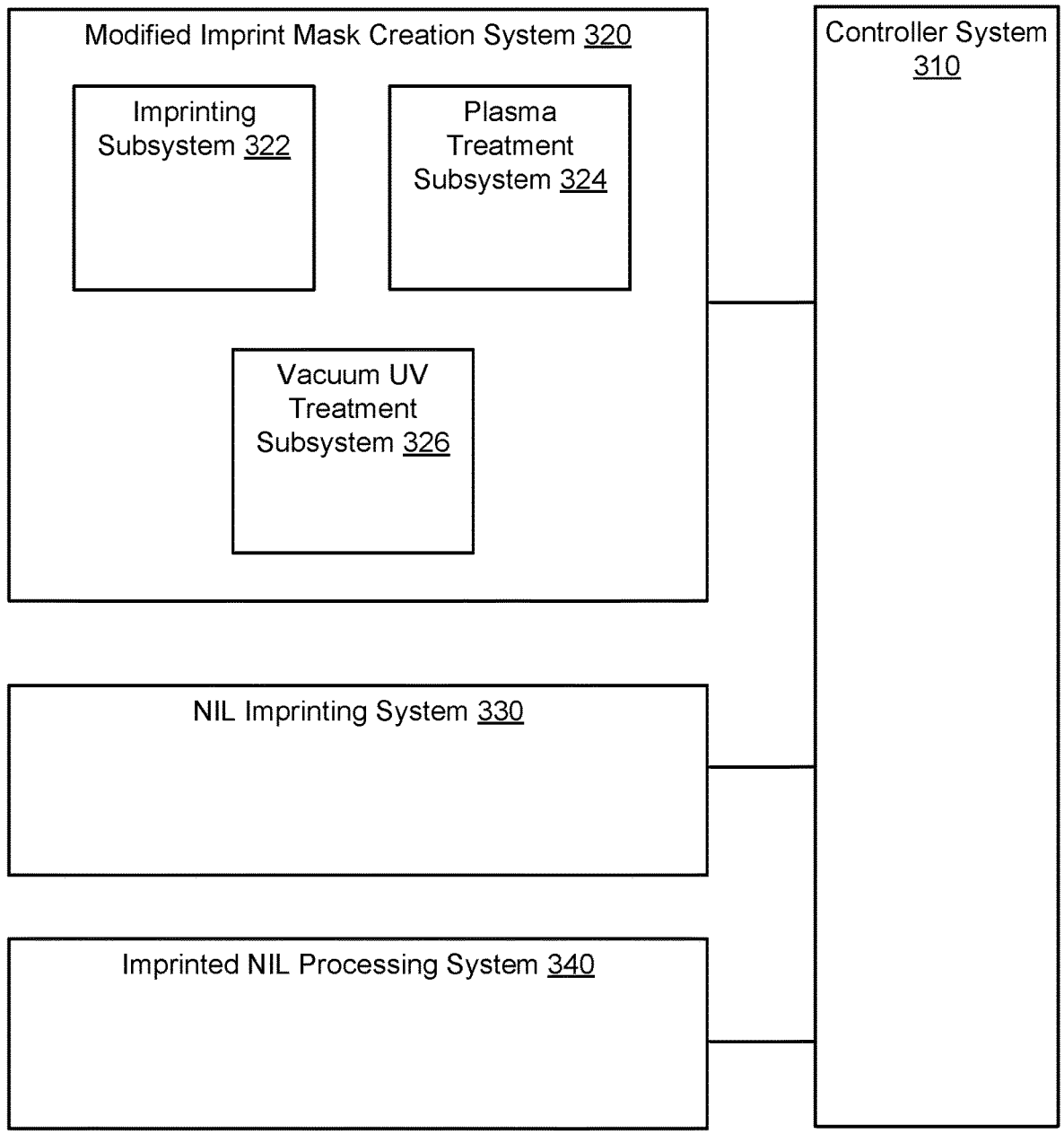
FIG. 3 illustrates an exemplary system for nano-imprint lithography and creation of an imprint mask with low surface energy, according to an embodiment.

FIG. 3 illustrates an exemplary system for nano-imprint lithography and creation of an imprint mask with low surface energy, according to an embodiment. The NIL system 300 includes a controller 310, a modified imprint mask creation system 320, a NIL imprinting system 330, and an NIL post-processing system 340. Although certain elements are shown in the NIL system 300, in other embodiments the system 300 includes other elements, and the processes performed by the elements may differ from those shown in NIL system 300 and described here.

The controller 310 generates instructions for the modified imprint mask creation system 320, the NIL imprinting system 330, and the NIL post-processing system 340, in order to create the imprinted NIL material using a modified imprint mask. The instructions generated by the controller 310 may be based on various configuration settings provided by an administrator or other system (e.g., a semiconductor fabrication system). These configuration settings may include a type of pattern to be imprinted, a type of plasma treatment to be used on the imprint mask, curing process to be used (e.g., thermal or UV), post-processing options to be applied, the type of NIL material, mask material, substrate material, and other materials to be used in the imprinting process, and so on. Based on these configuration options, the controller 310 transmits instructions to the various systems 320, 330, and 340 to instruct these systems on what materials to use, what processes to execute, when to execute these processes, and so on, in order to create the final imprinted NIL material according to the configuration settings.

For example, the controller 310 may send a set of etching instructions to the NIL imprinting system 330 to create a master mold according to an imprinting pattern and to create a mask using the master mold, with the mask having an inverse pattern of the imprinting pattern. As another example, if the configuration options include UV curing, the controller 310 may transmit instructions to the NIL imprinting system 330 to activate a UV light source against the NIL imprint material at a certain intensity for a certain duration.

The modified imprint mask creation system 320, based on instructions from the controller 310, creates a modified mask with low surface energy, e.g., the modified mask 104. The modified imprint mask creation system 320 may include an imprinting subsystem 322, a plasma treatment subsystem 324, and a vacuum UV treatment subsystem 326.

The imprinting subsystem 322 may receive instructions on the creation of the modified mask. These instructions may indicate the type of material to use for a master mold (e.g., master mold 206) and a type of material to use for the modified mask, which is created as an inverse pattern of the pattern of the master mold. The instructions also include the type of pattern to be created. This may be specified using a three dimensional coordinate system, e.g., as a polygonal mesh, or as a set of instructions for using various material removal tools (e.g., etching, ablation) to remove material from a block of the master mold material in a specific sequence, with a specific amount, and so on, to create the pattern of the master mold. The imprinting subsystem 322 may apply the material indicated in the instructions, as well as the instructions for the pattern, in order to create the master mold. The imprinting subsystem 322 uses the master mold to imprint upon the imprint mask material, such as imprint mask material 202. This creates the imprint mask, e.g., imprint mask 208. The imprint mask material may be selected by the imprinting subsystem 322 based on the material specified in the instructions for the NIL material to be imprinted. For example, an imprint mask material may be selected which, after modification through plasma treatment and/or vacuum UV treatment, has a lower surface energy than the NIL material.

The plasma treatment subsystem 324 and the vacuum UV treatment subsystem 326 further modify the imprint mask to create the modified mask. The plasma treatment subsystem 324, upon receiving instructions from the controller 310, places the imprint mask in a chamber (e.g., such as a chamber in an etcher, dep system), and injects a plasma into the chamber. The plasma contains one or more fluorocarbons, as specified by the instructions. The plasma treatment subsystem 324 applies the plasma treatment to the imprint mask for a specified duration, temperature, pressure, and/or concentration, as specified by the instructions.

The vacuum UV subsystem 326, either simultaneously or subsequent to the plasma treatment, applies UV light with a wavelength in the vacuum UV range, to the imprint mask, based on instructions from the controller 310. The vacuum UV subsystem 326 may first evacuate any gases which may adsorb the UV light before applying the UV light to the imprint mask. The duration, intensity, and/or frequency of the light applied may be specified by the instructions. The resulting modified mask is ready for imprinting the NIL material.

The plasma treatment subsystem 324 and/or vacuum UV subsystem 326 may test the surface energy of the modified mask by measuring the energy required to create a new surface on the material, or the energy required to remove a sample of NIL material and then to detach it. If these energies fall outside a threshold range, the modified mask may be discarded and a new one is prepared.

The NIL imprinting system 330, based on instructions from the controller 310, imprints the NIL material with a pattern using the modified mask to create an imprint layer that includes the NIL material imprinted with the pattern from the mask. To apply the modified mask to a layer of NIL material, such as NIL material 102, the NIL imprinting system 330 may form a layer of the NIL material, using a deposition method such as spin coating, on a substrate. The NIL imprinting system 330 may then apply the modified mask to the NIL material layer. The application force, duration, speed, and other parameters may be specified by the instructions as well. These instructions may apply to both the application and release of the mask from the NIL material. After imprinting the mask upon the NIL material, the NIL material modification system 330 may be utilized to modify the NIL material, creating a layer of NIL material that has been imprinted with the imprint pattern of the modified mask. This imprint layer may undergo additional post-processing steps by the NIL post-processing system 340, in order to create a final imprint layer.

The NIL post-processing system 340 performs post processing steps on the NIL material after imprinting and after the modification by the NIL material modification system 330, based on instructions from the controller 310. This may include the application of an overcoat, annealing under high temperatures, etching to create additional patterns, orthogonal cross linking of NIL material polymers, oxygen plasma treatment, and so on. For example, the NIL material may be further etched in order to increase the prominence of the imprinted pattern on the NIL material. If the NIL material were of low modulus, this etching process may cause feature shrinkage and other deformities within the imprinted pattern of the NIL material. However, by having a high modulus NIL material, these disadvantages are reduced.

EXEMPLARY FLOWS

Figure 4:
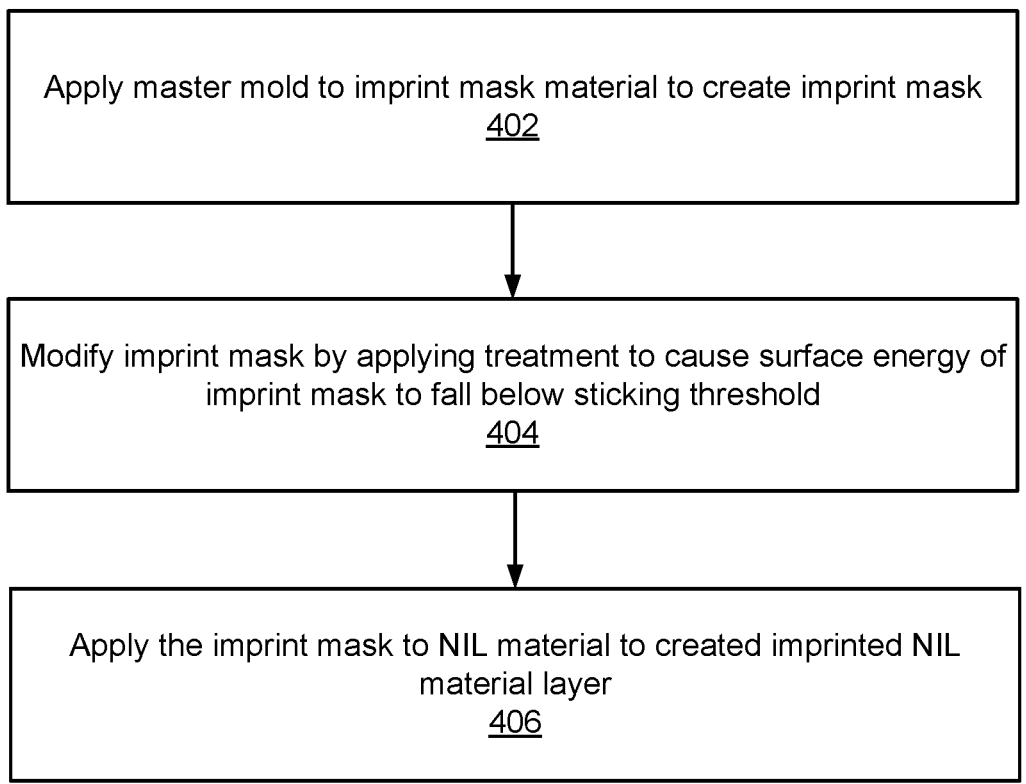
FIG. 4 is a flow chart illustrating a method for NIL using an imprint mask with low surface energy, according to an example embodiment.

FIG. 4 is a flow chart illustrating a method for NIL using an imprint mask with low surface energy, according to an example embodiment. Although the flow chart exhibits a certain order, this is not meant to imply that the process described herein must be performed in this order. The operations described here may be performed by the NIL system 300 of FIG. 3.

The NIL system 300 applies 402 a master mold to an imprint mask material to create an imprint mask, such as imprint mask 208. This imprint mask has not been modified and may have a high surface energy. This high surface energy may cause a mismatch with the surface energy of any NIL material that is imprinted using the imprint mask, causing the NIL material to stick to the imprint mask when the imprint mask is detached from the NIL material. This sticking may cause the NIL material to break, and render the imprinted NIL material defective.

The NIL system 600 modifies 704 the imprint mask by applying a treatment to the imprint mask to cause a surface energy level of the imprint mask to fall below a sticking threshold. As described above, this treatment may include a plasma treatment with a fluorocarbon as well as a vacuum UV treatment. The lowered surface energy of the modified mask may not stick to the NIL material when it is later detached, leaving the pattern on the NIL material intact and non-defective.

The NIL system 600 applies 306 the modified imprint mask to a nano-imprint lithography (NIL) material to create an imprinted NIL material layer. The surface energy level of the imprint mask causes a shape of the imprinted NIL material layer to be remain unchanged when the imprinted NIL material layer is detached from the modified imprint mask, as the NIL material does not stick to the surface of the modified imprint mask.

The foregoing description of the embodiments has been presented for the purpose of illustration; it is not intended to be exhaustive or to limit the embodiments to the precise forms disclosed. Many modifications and variations are possible in light of the above disclosure.

Finally, the language used in the specification has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the embodiments is intended to be illustrative, but not limiting, of the scope, which is set forth in the following claims.

What is claimed is:

1. A method, comprising:
applying a master mold to an imprint mask material to create an imprint mask;
forming a graphitized carbon layer on a surface of the imprint mask to cause a surface energy of the modified imprint mask to fall below a sticking threshold by:
applying a plasma treatment to the surface of the imprinted mask, and
after the plasma treatment is applied to the surface of the imprinted mask, exposing the surface of the imprinted mask to ultraviolet (UV) light; and
applying the modified imprint mask to a nano-imprint lithography (NIL) material layer to create an imprinted NIL material layer, the surface energy level of the modified imprint mask causing a shape of the imprinted NIL material layer to remain unchanged when the imprinted NIL material layer is detached from the modified imprint mask.

2. The method of claim 1, wherein the plasma treatment is an application of a fluorocarbon plasma to the surface of the imprint mask.

3. The method of claim 2, wherein the fluorocarbon is composed of one of $CF_4$, $CHF_3$, $CH_2F_2$, $CH_3F$, $C_4F_8$, $C_4F_6$, $C_2F_6$, and $C_2F_8$.

4. The method of claim 1, wherein the UV light is in a wavelength range of 10 nm to 200 nm.

5. The method of claim 1, wherein the imprinted NIL material layer has a modulus level beyond a strength threshold, the imprinted NIL material layer having a structure that remains unaffected by a subsequent process to form a second imprint layer matching a pattern of the master mold.

6. The method of claim 1, wherein the surface energy level of the modified imprint mask is less than a surface energy level of the NIL material layer.

7. The method of claim 1, wherein forming the graphitized carbon layer on the surface of the imprint mask to cause the surface energy of the modified imprint mask to fall below a sticking threshold further comprises:
evacuating gas from a chamber where the imprinted mask is placed before exposing the surface of the imprinted mask to the UV light.

8. The method of claim 1, further comprising:
measuring the surface energy of the modified imprinted mask; and
determining that the surface energy of the modified imprinted mask is below the sticking threshold before applying the modified imprint mask to the NIL material layer.

9. The method of claim 1, further comprising:
etching the imprinted NIL material layer to increase prominence of a pattern of the imprinted NIL material layer.

10. The method of claim 1, further comprising:
inducing cross linkage of polymers of the imprinted mask material to further cause the surface energy of the modified imprint mask to fall below a sticking threshold.

* * * * *